(12) United States Patent
Itoh

(10) Patent No.: US 6,411,171 B2
(45) Date of Patent: Jun. 25, 2002

(54) VOLTAGE CONTROLLED OSCILLATOR

(75) Inventor: Nobuyuki Itoh, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/789,542

(22) Filed: Feb. 22, 2001

(30) Foreign Application Priority Data

Feb. 25, 2000 (JP) ........................................ 2000-049569

(51) Int. Cl.[7] .............................. H03B 5/08; H03B 5/12
(52) U.S. Cl. ............................. 331/117 R; 331/117 FE; 331/175; 331/177 R; 331/177 V
(58) Field of Search ................................. 331/34, 36 C, 331/117 R, 117 FE, 117 D, 175, 177 R, 177 V

(56) References Cited

U.S. PATENT DOCUMENTS 5,175,884 A * 12/1992 Suarez ........................ 455/260
6,188,287 B1 * 2/2001 Avanic et al. ................ 331/11

\* cited by examiner

*Primary Examiner*—David Mis
(74) *Attorney, Agent, or Firm*—Oblon, Spivak, McClelland, Maier & Neustadt, P.C.

(57) ABSTRACT

A voltage controlled oscillator includes an amplifier having a positive feedback construction, configured to output an oscillation signal of a frequency corresponding to a control voltage supplied to a variable capacitor of a tank circuit having an inductor and the variable capacitor, and a variable current source configured to change an operation current supplied to the amplifier according to the control voltage. When a certain oscillation frequency at which phase noise becomes minimum is set as a reference point, the variable current source increases the operation current supplied to the amplifier as the oscillation frequency becomes lower than the certain oscillation frequency, or decreases the operation current supplied to the amplifier as the oscillation frequency becomes higher than the certain oscillation frequency. With this construction, a voltage controlled oscillator having a stable and sufficiently suppressed phase noise characteristic can be realized irrespective of the oscillation frequency.

20 Claims, 7 Drawing Sheets

VOLTAGE CONTROLLED OSCILLATOR

CROSS-REFERENCE TO RELATED APPLICATIONS

This application is based upon and claims the benefit of priority from the prior Japanese Patent Application No. 2000-049569, filed Feb. 25, 2000, the entire contents of which are incorporated herein by reference.

BACKGROUND OF THE INVENTION

This invention relates to a voltage controlled oscillator.

The construction of a conventional voltage controlled oscillator is shown in FIG. 1. In the conventional voltage controlled oscillator, a control voltage Vctrl for controlling the oscillation frequency is used only for controlling the variable capacitance of a tank circuit 101 including a spiral inductor L and variable capacitance diodes (variable capacitance elements) D1 and D2 formed in the same semiconductor substrate.

The oscillation frequency of the voltage controlled oscillator is determined by the following equation (1).

$$fosc = 1/(2\pi(LC)^{1/2}) \quad (1)$$

In the equation (1), L denotes the inductance of the spiral inductor L and C denotes the total sum of the capacitances of the variable capacitors C1, C2 and the parasitic capacitance associated with the whole elements constructing the voltage controlled oscillator.

In the voltage controlled oscillator, it is necessary to change the oscillation frequency according to the control voltage vctrl. Therefore, in FIG. 1, the intermediate potential of a node of the variable diodes D1 and D2 is controlled by the control voltage Vctrl to change the junction capacitances of the variable capacitors D1 and D2, thereby making it possible to attain a desired oscillation frequency.

As the characteristic of the voltage controlled oscillator, the oscillation frequency, variable frequency range and phase noise which is a parameter indicating the fineness of the oscillating frequency are very important.

The precision of the oscillation frequency is determined by the precision of the inductor L and the variable capacitors C1 and C2. The variable frequency range is determined by the capacitance variable range of the variable capacitors C1, C2 and the parasitic capacitance of the whole elements constructing the voltage controlled oscillator. The phase noise is determined by the parasitic resistance of the whole elements constructing the voltage controlled oscillator and a current Icc flowing in an amplifier 103.

The phase noise in a range in which thermal noise exists as a main component thereof is expressed by the following equation (2).

$$L(foffset) = kTReff(1+A)(fosc/foffset)^2/Vrms^2 \quad (2)$$

In the equation (2), k indicates the Boltzmann's constant, T indicates the absolute temperature, Reff indicates the total sum of parasitic resistances of the whole elements constructing the voltage controlled oscillator, fosc indicates the oscillation frequency, and foffset indicates an offset frequency used for observing the phase noise and corresponding to a frequency offset from the oscillation frequency fosc. Vrms indicates an output amplitude of the oscillator.

The parameter A in the equation (2) is expressed by the following equation (3).

$$A = Gm, amp/Gneg \quad (3)$$

That is, the ratio of energy Gm,amp consumed in the whole portion of the amplifier 103 to energy Gneg consumed in the tank circuit 101 is indicated by the parameter A.

Further, Gneg can be expressed by the oscillation frequency fosc, capacitance C and resistance Reff as indicated by the following equation (4).

$$Gneg = Reff(2\pi Cfosc)^2 \quad (4)$$

As is clearly understood from the equation (2), the most important cause of the phase noise in the voltage controlled oscillator is the thermal noise caused by the parasitic resistance in the tank circuit 101, that is, Reff in the equation (2), but in the tank circuit 101 and amplifier 103 in which the thermal noise is sufficiently suppressed, noise caused by excessive current noise gives an extremely large influence. This is because excessive energy (current) is supplied for energy to be consumed in the tank circuit 101 and amplifier 103. As indicated by the equation (4), energy consumed in the tank circuit 101 and amplifier 103 is changed according to the oscillation frequency generated by the tank circuit 101.

It is also clearly understood from the equation (2) that output oscillation of the amplifier 103 also gives a large influence to the phase noise of the voltage controlled oscillator. Generally, the output amplitude and amplification factor of a high-frequency amplifier depend on the parasitic capacitance of the whole elements constructing the high-frequency amplifier.

In the conventional voltage controlled oscillator with the above construction, the variable capacitance diodes D1 and D2 are used to change the oscillation frequency, but the capacitance C in the equation (1) is required to be made larger as the oscillation frequency becomes lower. Therefore, the amplifier 103 is operated in a state in which the parasitic capacitance is extremely large as viewed from the amplifier side.

With the above fact taken into consideration, in a voltage controlled oscillator designed based on a certain oscillation frequency, the output amplitude thereof becomes smaller and the phase noise will be increased when the voltage controlled oscillator is used at a frequency lower;than the designed oscillation frequency.

Further, in a voltage controlled oscillator designed based on a certain oscillation frequency, an influence by excessive current noise becomes larger and the phase noise will be also increased when the voltage controlled oscillator is used at a frequency higher than the designed oscillation frequency.

FIG. 2 is a diagram showing the oscillation frequency dependency characteristic of the phase noise in the voltage controlled oscillator of FIG. 1. At the oscillation frequency of approximately 1235 MHz, the phase noise of the voltage controlled oscillator exhibits the minimum value. However, in a low frequency range lower than the above frequency and in a high frequency range higher than the above frequency, the phase noise is gradually increased.

It is considered that the above phenomenon occurs due to the reason described before. That is, the whole phase noise is increased by the excessive current at frequencies higher than the oscillation frequency at which the phase noise exhibits the minimum value. On the other hand, the whole phase noise is increased by a reduction in the output amplitude at frequencies lower than the oscillation frequency at which the phase noise exhibits the minimum value. FIG. 3 is a diagram showing the oscillation frequency dependency characteristic of the output amplitude in the voltage controlled oscillator of FIG. 1. FIG. 3 shows that the output amplitude is lowered as the oscillation frequency becomes lower and it is clearly understood from the equation (2) that the phase noise becomes larger with a decrease in the oscillation frequency.

Therefore, it has been desired to realize a voltage controlled oscillator having a stable and sufficiently suppressed phase noise characteristic irrespective of the oscillation frequency.

BRIEF SUMMARY OF THE INVENTION

An object of this invention is to provide a voltage controlled oscillator having a stable and sufficiently suppressed phase noise characteristic irrespective of the oscillation frequency.

In order to attain the above object, a voltage controlled oscillator according to a first aspect of this invention comprises an amplifier circuit having a positive feedback construction, configured to output a signal of an oscillation frequency corresponding to a control voltage supplied to a variable capacitance element of a tank circuit having an inductor and the variable capacitance element; and a variable current source configured to change an operation current supplied to the amplifier circuit according to the control voltage; wherein, when a certain oscillation frequency at which phase noise becomes minimum is set as a reference point, the variable current source increases the operation current supplied to the amplifier circuit as the oscillation frequency becomes lower than the certain oscillation frequency, or decreases the operation current supplied to the amplifier circuit as the oscillation frequency becomes higher than the certain oscillation frequency.

A voltage controlled oscillator according to a second aspect of this invention comprises a control terminal to which a control voltage in a preset voltage range is supplied from an exterior; a first current source configured to output a preset first current; a second current source supplied with the control voltage from the control terminal, configured to output a second current controlled by the control voltage; a current mirror circuit supplied with a third current obtained by adding the first and the second current, and configured to supply a fourth current which is a mirror current of the third current; an oscillation circuit into which the fourth current of the current mirror circuit flows, the amplifier circuit including two variable capacitance diodes whose cathodes are connected together and supplied with the control voltage, an inductor connected between two anodes of the two variable capacitance diodes and cooperating with the variable capacitance diodes to oscillate at a frequency controlled by the control voltage, and at least one positive feedback circuit which is connected between the two anodes of the two variable capacitance diodes and into which the fourth current of the current mirror circuit flows; and two output terminals respectively connected to the anodes of the two variable capacitance diodes.

A voltage controlled oscillator according to a third aspect of this invention comprises a control terminal to which a control voltage in a preset voltage range is supplied from an exterior; a first current source into which a preset first current flows; a second current source which is supplied with the control voltage from the control terminal and into which a second current controlled by the control voltage flows; a current mirror circuit supplied with a third current obtained by adding the first and the second current and configured to supply a fourth current which is a mirror current of the third current; an oscillation circuit into which the fourth current of the mirror circuit flows, the oscillation circuit including two variable capacitance diodes, anodes of which are connected together and supplied with the control voltage, an inductor connected between two cathodes of the two variable capacitance diodes and cooperating with the variable capacitance diodes to oscillate at a frequency controlled by the control voltage, and at least one positive feedback circuit which is connected between the two cathodes of the two variable capacitance diodes and into which the fourth current of the current mirror circuit flows; and two output terminals respectively connected to the cathodes of the two variable capacitance diodes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 4:
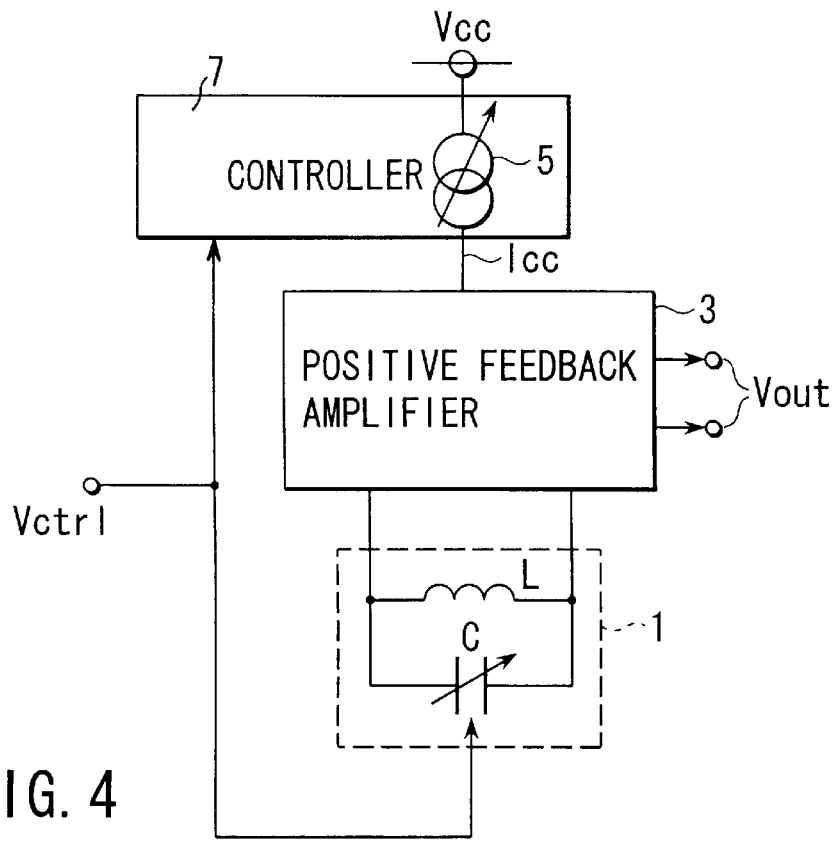
FIG. 4 is a diagram showing the basic construction of a voltage controlled oscillator of this invention.

The main points of this invention are explained before explaining embodiments. The basic construction of a voltage controlled oscillator of this invention is shown in FIG. 4. In FIG. 4, an inductor L and a variable capacitance element C constitute a tank circuit 1. An amplifier 3 outputs an oscillation signal obtained by amplifying a resonance signal generated in the tank circuit 1. A current source circuit for operating the amplifier 3 is a variable current source circuit 5 as will be described below. A control circuit 7 controls the operation of the variable current source circuit 5 according to the control voltage Vctrl. Therefore, the variable current source circuit 5 changes a value of the current supplied to the amplifier 3.

Figure 1:
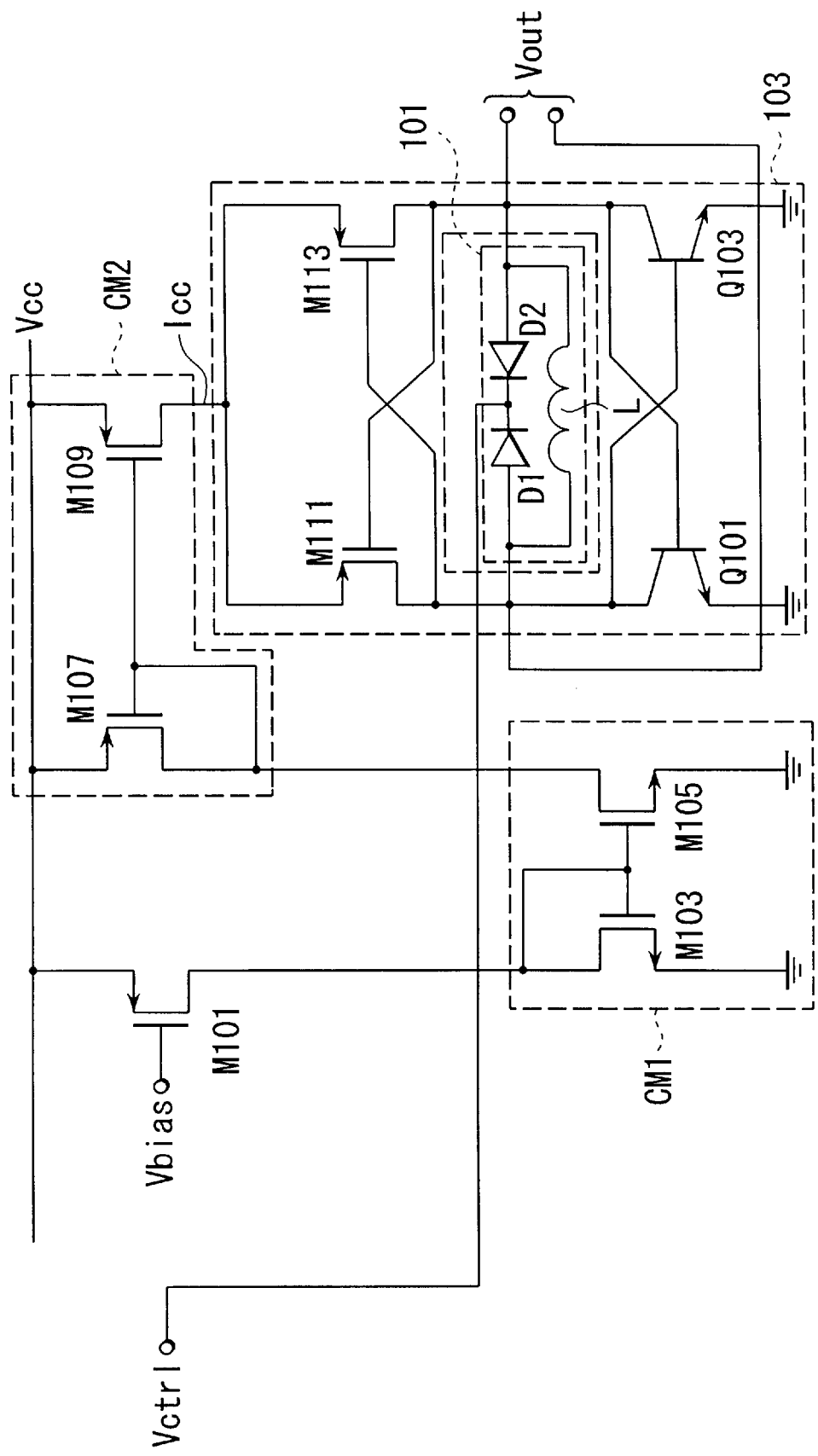
FIG. 1 is a circuit diagram showing the construction of a conventional voltage controlled oscillator.
Figure 2:
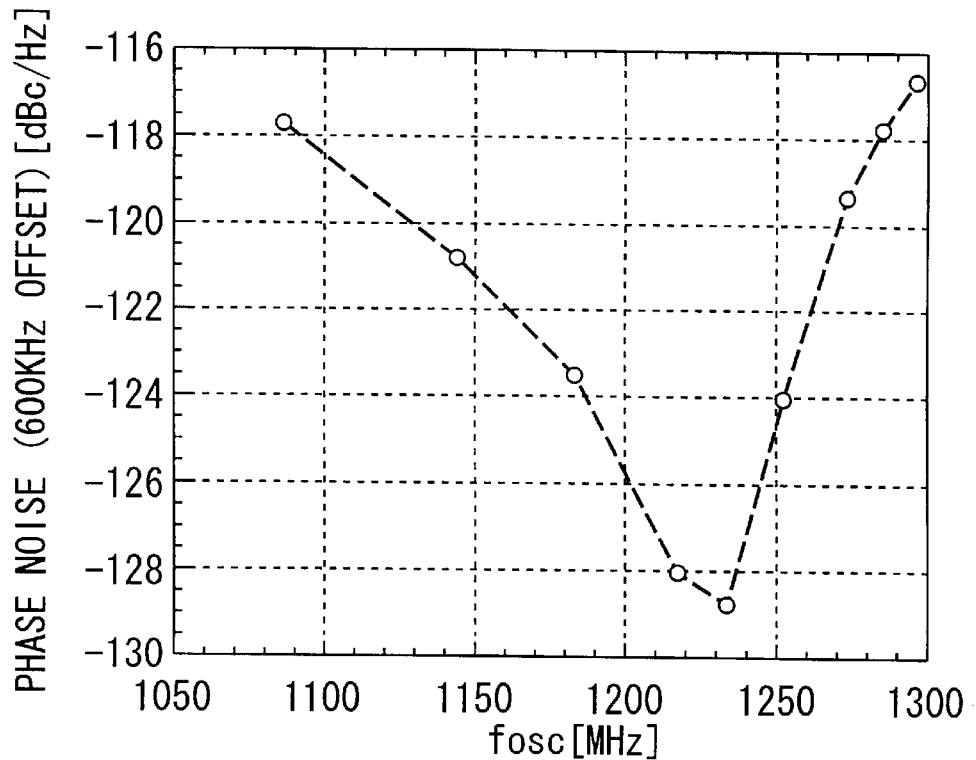
FIG. 2 is a diagram showing the oscillation frequency dependency characteristic of the phase noise in the voltage controlled oscillator of FIG. 1.
Figure 3:
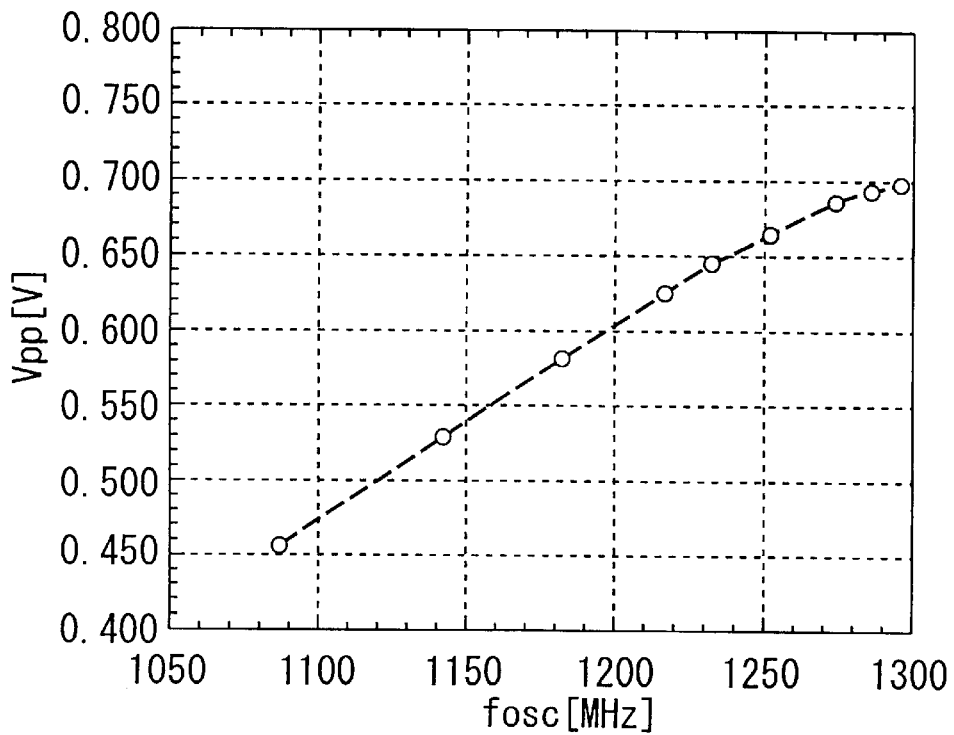
FIG. 3 is a diagram showing the oscillation frequency dependency characteristic of the output amplitude in the voltage controlled oscillator of FIG. 1.

In this invention, in order to eliminate the oscillation frequency dependency of the phase noise in the conventional case shown in FIG. 2, basically, attention is paid to two points.

One point is to set the oscillation frequency exhibiting the minimum value of the phase noise explained in "BACK-GROUND OF THE INVENTION" to the highest oscillation frequency of the voltage controlled oscillator. In this case, since the output amplitude is lowered and the phase noise becomes larger as the oscillation frequency becomes lower, it is required to increase the current supplied to the amplifier 3 from the variable current source circuit 5 and increase the output amplitude as the oscillation frequency becomes lower.

The other point is to set the oscillation frequency exhibiting the minimum value of the phase noise explained in "BACKGROUND OF THE INVENTION" to the lowest oscillation frequency of the voltage controlled oscillator. In this case, since the phase noise is increased with an increase in the current noise due to an excessive current as the oscillation frequency becomes higher, it is required to reduce the current supplied to the amplifier 3 from the variable current source circuit 5 and reduce the current noise component as the oscillation frequency becomes higher.

The above two points are the same as the result, and the current supplied to the amplifier 3 is increased in the low oscillation frequency range and the current supplied to the amplifier 3 is reduced in the high oscillation frequency range.

First Embodiment

Figure 5:
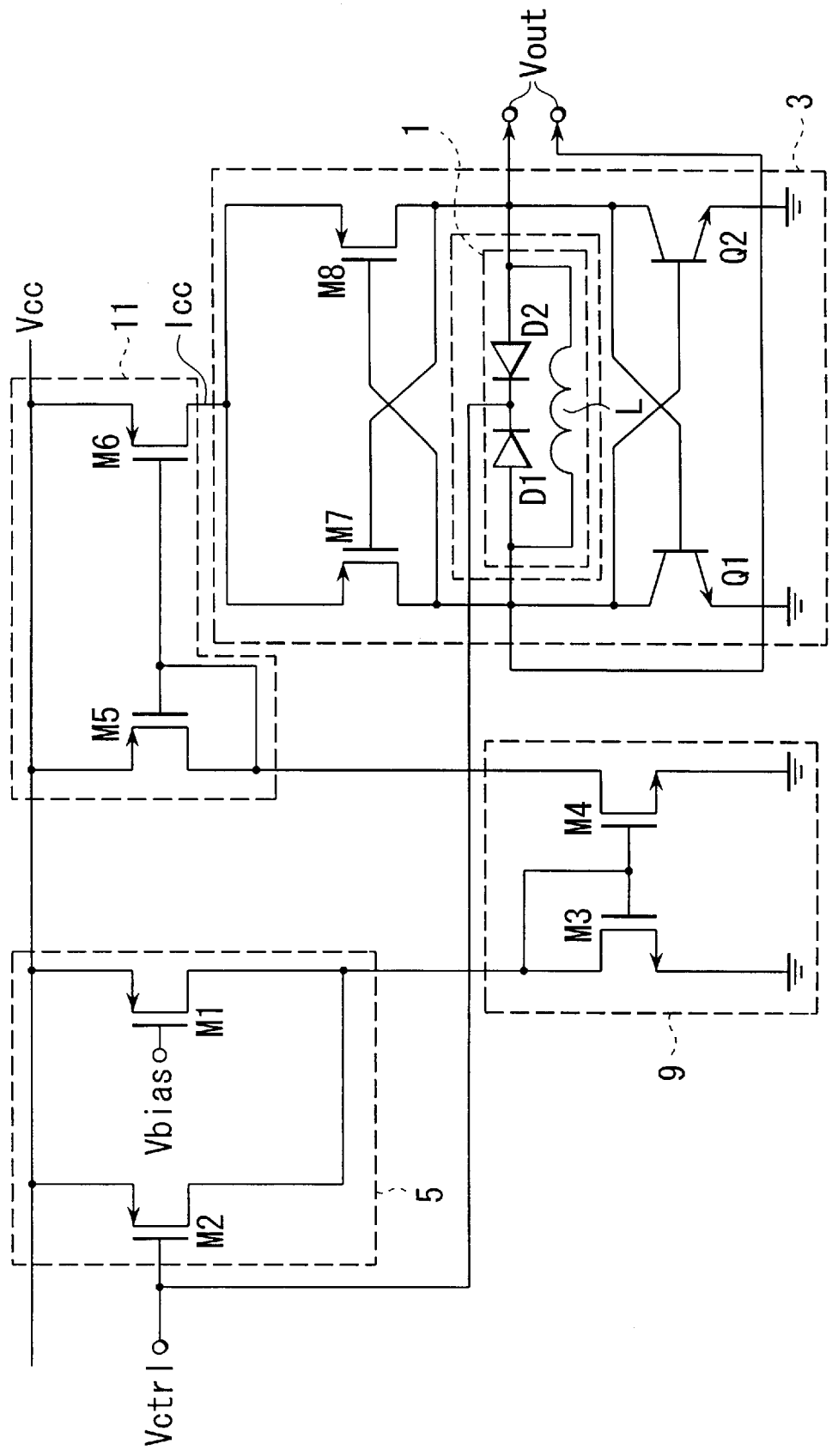
FIG. 5 is a circuit diagram of a first embodiment of the voltage controlled oscillator of this invention.

A circuit diagram of a first embodiment of a voltage controlled oscillator of this invention is shown in FIG. 5. In FIG. 5, a tank circuit 1 includes an inductor L and variable capacitance diodes D1 and D2. The anode of the variable capacitance diode D1 is connected to one end of the inductor L and the cathode thereof is connected to the cathode of the variable capacitance diode D2. The anode of the variable capacitance diode D2 is connected to the other end of the inductor L. A control voltage Vctrl is supplied to the commonly connected cathodes of the variable capacitance diodes D1 and D2.

An amplifier 3 includes a positive feedback amplifier formed of NPN transistors Q1 and Q2 and a positive feedback amplifier formed of P-MOSFETs M7 and M8.

The emitter of the transistor Q1 is grounded, the base thereof is connected to the collector of the transistor Q2 and the other end of the inductor L, and the collector thereof is connected to the base of the transistor Q2 and one end of the inductor L. The emitter of the transistor Q2 is grounded, the base thereof is connected to the collector of the transistor Q1 and one end of the inductor L, and the collector thereof is connected to the other end of the inductor L.

The drain of the FET M7 is connected to the gate of the FET M8 and one end of the inductor L, the gate thereof is connected to the drain of the FET M8 and the other end of the inductor L, and the source thereof is connected to the drain of a P-MOSFET M6. The drain of the FET M8 is connected to the other end of the inductor L, the gate thereof is connected to one end of the inductor L, and the source thereof is connected to the drain of the P-MOSFET M6.

P-MOSFETs M5 and M6 constitute a current mirror circuit 11. The drain of the FET M5 is connected to the gate thereof and the gate of the FET M6, and the source thereof is connected to a power supply Vcc. The source of the FET M6 is also connected to the power supply Vcc.

N-MOSFETs M3 and M4 constitute a current mirror circuit 9. The source of the FET M3 is grounded and the drain thereof is connected to the gate thereof and the gate of the FET M4. The source of the FET M4 is grounded and the drain thereof is connected to the drain of the FET M5.

P-MOSFETs M1 and M2 constitute a variable current source circuit 5. The drain of the FET M1 is connected to the drains of the FETs M2 and M3, the source thereof is connected to the power supply vcc and the gate thereof is applied with a bias voltage. Thus, the FET M1 is normally kept in the ON state and acts as a constant current source.

The drain of the FET M2 is connected to the drain of the FET M3, the source thereof is connected to the power supply Vcc, and the gate thereof is supplied with the control voltage Vctrl for controlling the oscillation frequency via a resistor (not shown). Since the voltage value between the source and drain of the FET M2 is smaller than the absolute value of the threshold voltage of the FET M2 when the control voltage Vctrl is high, the FET M2 is kept in the OFF state and no current flows. If the control voltage Vctrl is lowered, the voltage between the source and drain of the FET M2 increases and the FET M2 is turned ON so as to permit a current to flow.

Next, the operation of the voltage controlled oscillator of FIG. 5 is explained. The voltages across the junctions of the variable capacitance diodes D1 and D2 which are variable capacitance elements are lowered by lowering the control voltage Vctrl and the junction capacitances thereof increase. The characteristic is the same as that of the conventional junction diode. Therefore, the item C in the equation (1) becomes larger and the oscillation frequency is lowered.

On the other hand, if the control voltage Vctrl is increased, the item C in the equation (1) becomes smaller and the oscillation,frequency becomes higher. The voltage controlled oscillator is operated based on the principle described above.

In the first embodiment, in the first stage, the current Icc flowing in the amplifier 3 is controlled by turning ON only the FET M1 so as to make the phase noise minimum when the control voltage Vctrl is set at the maximum voltage (at this time, C is set at the minimum value and fosc is set at the highest frequency).

However, as described before, if the above state is left as it is, C becomes larger, fosc becomes lower and the output amplitude of the voltage controlled oscillator becomes smaller as the control voltage Vctrl is lowered. As a result, it is observed that the phase noise increases.

Therefore, it becomes necessary to provide a circuit for controlling the current Icc flowing in the amplifier 3 according to the control voltage Vctrl. In the first embodiment, by connecting the FET M2 for giving an additional current in parallel with the FET M1 in the variable current source circuit 5 and controlling the gate voltage of the FET M2 according to the control voltage Vctrl, a large amount of current is caused to flow so that the output amplitude can be kept substantially constant when the control voltage Vctrl is lowered (at this time, C becomes larger and fosc becomes lower).

That is, when the control voltage Vctrl is high (at this time, C is small and fosc is high), the FET M2 is turned OFF since the voltage value between the source and drain of the FET M2 becomes smaller than the absolute value of the threshold voltage of the FET M2. Therefore, no current flows in the FET M2 and a current Icc flowing into the amplifier 3 is determined by a current flowing in the FET M1. Thus, occurrence of the phase noise due to the current noise can be suppressed.

When the control voltage Vctrl is gradually lowered (C becomes larger), the oscillation frequency becomes lower, the voltage between the source and drain of the FET M2 which is the additional current source increases accordingly and the FET M2 is turned ON. As a result, the current Icc flowing into the amplifier 3 is increased. That is, the current supplied to the amplifier 3 is expressed by the following equation (5).

$$Icc=I(M1)+I(M2) \quad (5)$$

Thus, the output amplitude increases and occurrence of the phase noise can be suppressed.

In the first embodiment, when the FET M2 is not operated, that is, when the control voltage vctrl is set at the highest level (C is at the minimum value and fosc is at the highest frequency), the minimum current flowing into the amplifier 3 is approximately 1.2 mA.

Figure 6:
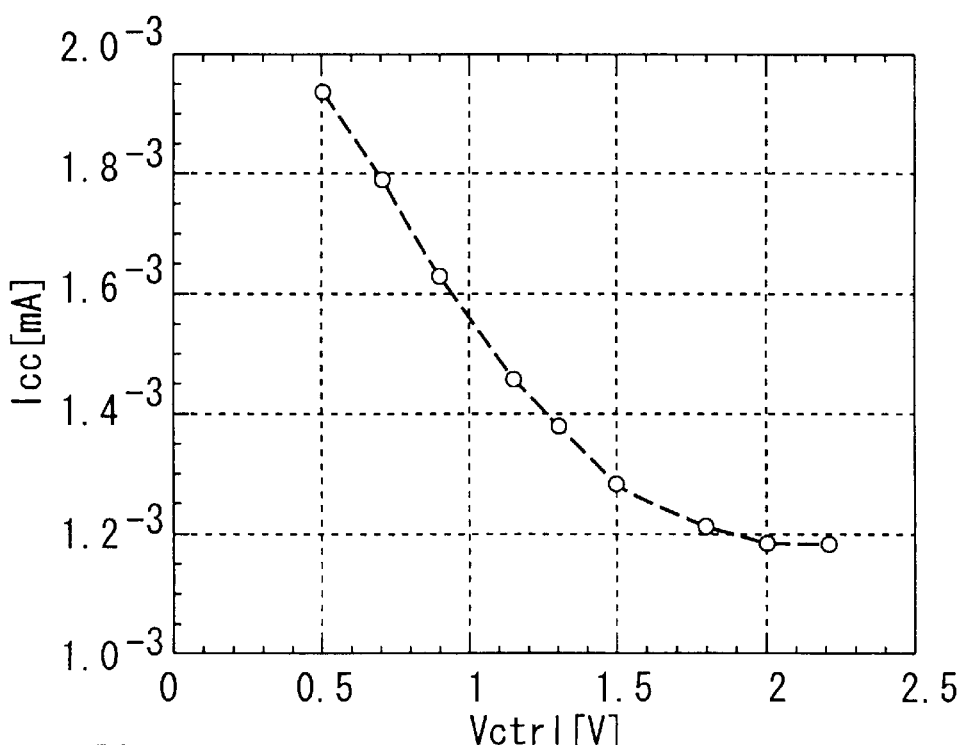
FIG. 6 is a diagram showing the control voltage dependency characteristic of a current Icc flowing in an amplifier of the voltage controlled oscillator of FIG. 5.

FIG. 6 shows the control voltage dependency of the current Icc flowing into the amplifier 3 of the voltage controlled oscillator. In a state in which the control voltage Vctrl is set at the lowest voltage (C is maximum), that is, the lowest frequency is oscillated, the current Icc of approximately 2 mA flows into the amplifier 3 and in a state in which the control voltage Vctrl is set at the highest voltage (C is minimum), that is, the highest frequency is oscillated, the current Icc of approximately 1.2 mA flows into the amplifier 3. As a result, a stable output amplitude free from a large variation in the entire range of the oscillation frequency fosc can be attained.

Figure 7:
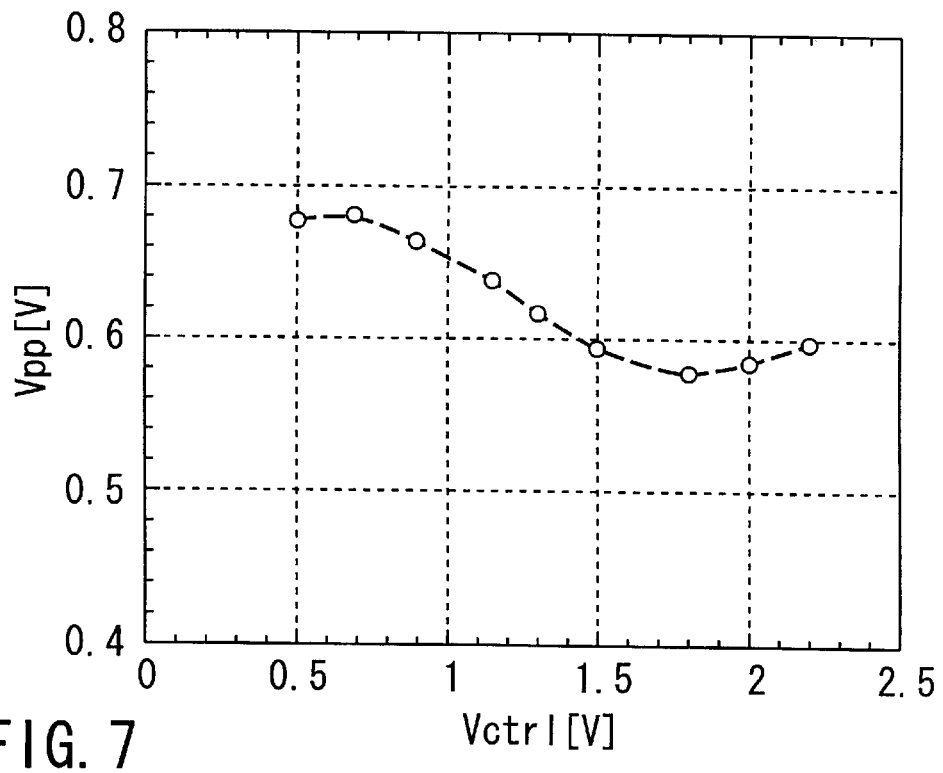
FIG. 7 is a diagram showing the control voltage dependency characteristic of the output amplitude in the voltage controlled oscillator of FIG. 5.

FIG. 7 shows the control voltage dependency of the output amplitude. In the first embodiment, it is possible to suppress a difference between the maximum and minimum output amplitudes to approximately 100 mv.

Based on the above results, the denominator of the equation (2), that is, the dependency of the output amplitude on the oscillation frequency can be suppressed to minimum.

Figure 8:
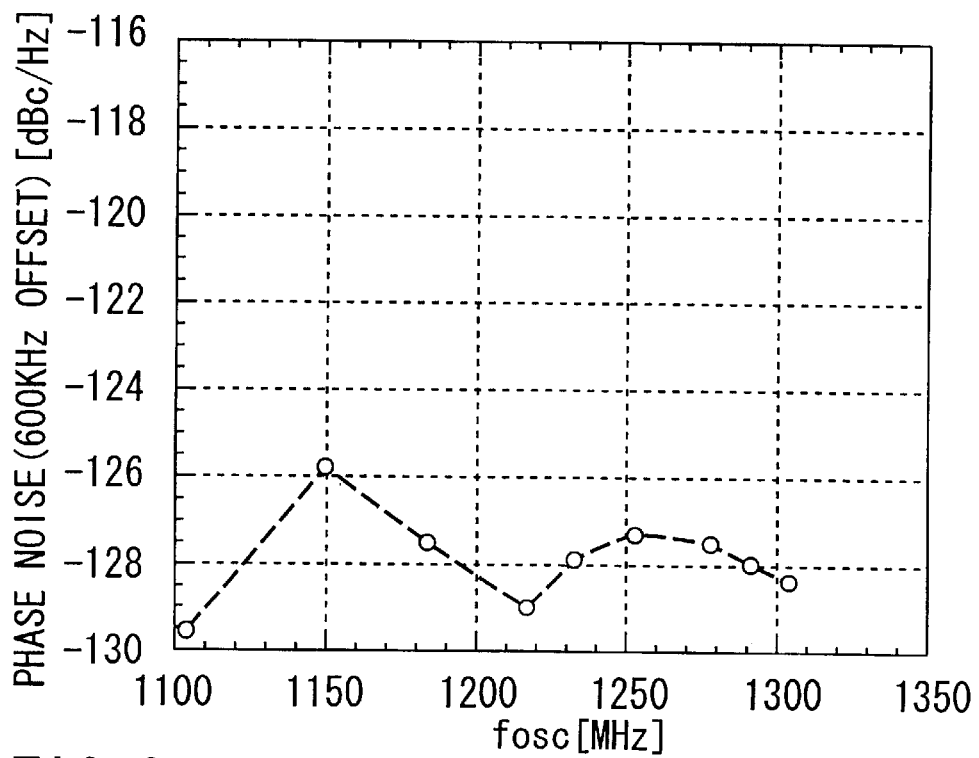
FIG. 8 is a diagram showing the oscillation frequency dependency characteristic of the phase noise in the voltage controlled oscillator of FIG. 5.

As a result, in the voltage controlled oscillator of the first embodiment, an extremely stable phase noise characteristic can be attained as shown in FIG. 8.

In the first embodiment, the frequency dependency of the phase noise is extremely small and can be suppressed within ±2 dB in the entire oscillation frequency range.

The following replacement can be made. N-MOSFETs are used instead of the NPN transistors Q1 and Q2. PNP transistors are used instead of the P-MOSFETs M7 and M8. PNP transistors are used instead of the P-MOSFETs M5 and M6. NPN transistors are used instead of the N-MOSFETs M3 and M4. A PNP transistor is used instead of the P-MOSFET M1. A PNP transistor is used instead of the P-MOSFET M2.

Further, the amplifier 3 can be formed of only one positive feedback amplifier and the other positive feedback amplifier can be replaced by two passive elements (for example, inductors) having one-side ends connected to the output terminal of the current mirror 11 or the ground potential node and the other ends respectively connected to the two output terminals.

The voltage controlled oscillator described above can be formed in one semiconductor substrate, but only the tank circuit 1 can be provided outside of the semiconductor substrate.

Second Embodiment

Figure 9:
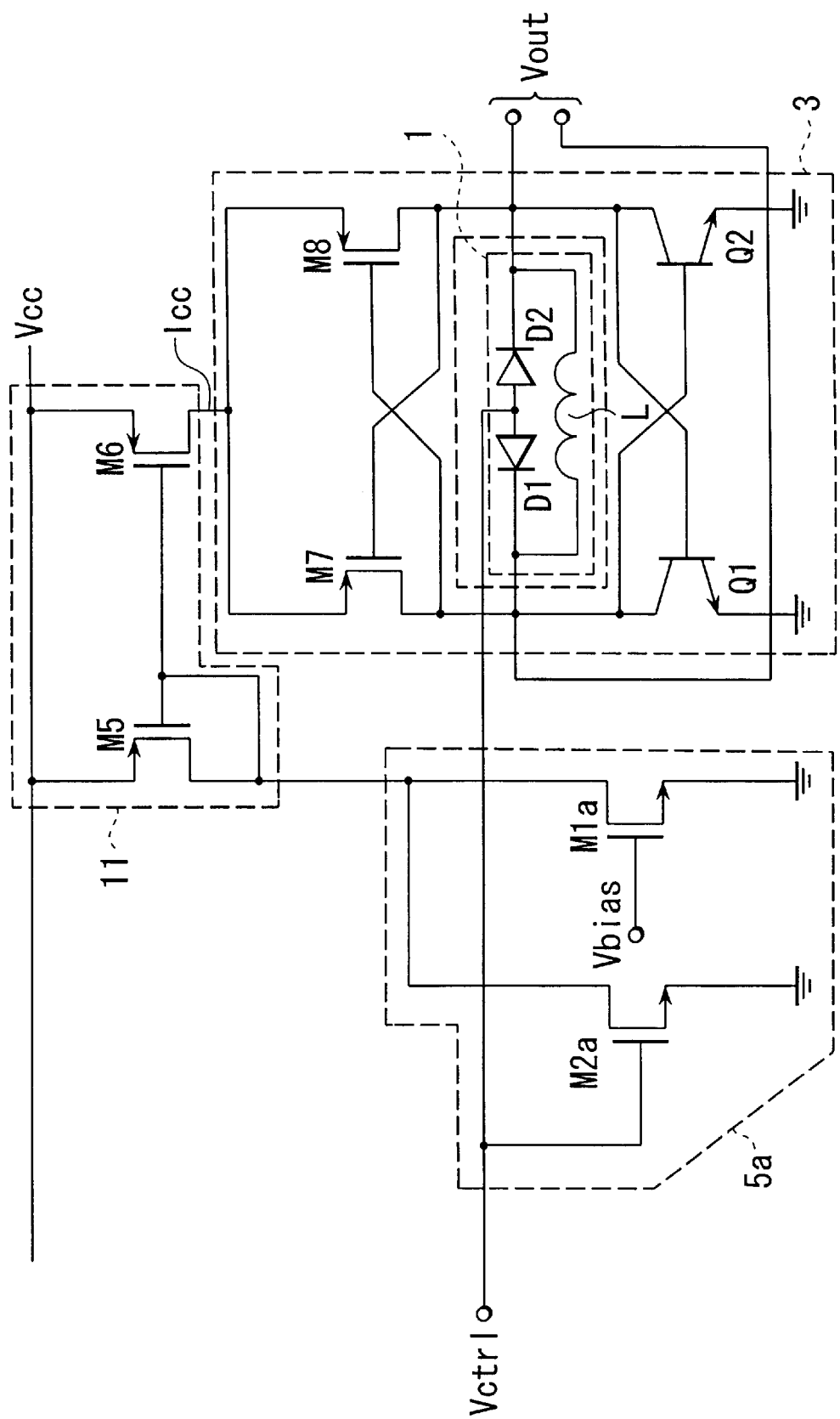
FIG. 9 is a circuit diagram of a second embodiment of a voltage controlled oscillator of this invention.

FIG. 9 is a circuit diagram of a second embodiment of a voltage controlled oscillator of this invention. This embodiment is an example of the voltage controlled oscillator in which the oscillation frequency becomes lower as the control voltage Vctrl becomes higher. Only a difference between this embodiment and the first embodiment of FIG. 5 is explained.

The cathode of a variable capacitance diode D1 is connected to one end of an inductor L and the anode thereof is connected to the anode of a variable capacitance diode D2. The cathode of the variable capacitance diode D2 is connected to the other end of the inductor L. The control voltage Vctrl is supplied to the common connection anodes of the variable capacitance diodes D1 and D2. The current mirror circuit 9 of FIG. 5 is omitted.

A variable current source circuit 5a includes N-MOSFETs M1a and M2a. The drain of the FET M1a is connected to the drains of the FETs M5 and M2a, the source thereof is grounded and the gate thereof is applied with a bias voltage. Thus, the FET M1a is normally kept in the ON state and acts as a constant current source.

The drain of the FET M2a is connected to the drain of the FET M5, the source thereof is grounded and the gate thereof is supplied with the control voltage Vctrl for controlling the oscillation frequency via a resistor (not shown). When the control voltage Vctrl is low, the voltage value between the gate and source of the FET M2a is smaller than the absolute value of the threshold voltage of the FET M2a and the FET M2a is set in the OFF state so as to prevent a current from flowing therethrough. If the control voltage Vctrl becomes high, the voltage between the gate and source of the FET M2a increases and the FET M2a is turned ON so as to permit a current to flow therethrough.

Next, the operation of the voltage controlled oscillator of FIG. 9 is explained. The voltages across the junctions of the variable capacitance diodes D1 and D2 which are variable capacitance elements are lowered by lowering the control voltage Vctrl and the junction capacitances thereof decrease. Therefore, the item C in the equation (1) becomes smaller and the oscillation frequency becomes high.

On the other hand, if the control voltage is raised, the item C in the equation (1) becomes larger and the oscillation frequency becomes lower. The voltage controlled oscillator is operated based on the principle described above.

In the second embodiment, in the first stage, an Icc flowing in the amplifier 3 is controlled by turning ON only the FET M1a so that the phase noise can be made minimum when the control voltage Vctrl is set at the minimum voltage (at this time, C is set at the minimum value and fosc is set at the highest frequency).

However, as described before, if the above state is left as it is, C becomes larger, fosc becomes lower and the output amplitude of the voltage controlled oscillator becomes smaller as the control voltage Vctrl becomes higher. As a result, it is observed that the phase noise increases.

Therefore, it becomes necessary to provide a circuit for controlling the current Icc flowing in the amplifier 3 according to the control voltage Vctrl. In the second embodiment, by connecting the FET M2a for giving an additional current in parallel with the FET M1a in the variable current source circuit 5a and controlling the gate voltage of the FET M2a according to the control voltage Vctrl, a large amount of current is caused to flow so that the output amplitude can be kept substantially constant when the control voltage Vctrl is raised (at this time, C becomes larger and fosc becomes lower).

That is, when the control voltage Vctrl is low (at this time, C is small and fosc is high), the FET M2a is turned OFF since the voltage value between the source and drain of the FET M2a becomes smaller than the absolute value of the threshold voltage of the FET M2a. Therefore, no current flows in the FET M2a and the current Icc flowing into the amplifier 3 is determined by a current flowing in the FET M1a. Thus, occurrence of phase noise due to current noise can be suppressed.

When the control voltage Vctrl is gradually raised, C becomes larger, and therefore, the oscillation frequency becomes lower, the voltage between the source and drain of the FET M2a which is the additional current source increases accordingly and the FET M2a is turned ON. As a result, the current Icc flowing into the amplifier 3 is increased. That is, the current supplied to the amplifier 3 is expressed by the following equation (6).

$$Icc=I(M1a)+I(M2a) \quad (6)$$

Thus, the output amplitude increases and occurrence of the phase noise can be suppressed.

The following replacement can be made. N-MOSFETs are used instead of the NPN transistors Q1 and Q2. PNP transistors are used instead of the P-MOSFETs M7 and M8. PNP transistors are used instead of the P-MOSFETs M5 and M6. An NPN transistor is used instead of the N-MOSFET M1a. An NPN transistor is used instead of the N-MOSFET M2a.

Further, the amplifier 3 can be formed of only one positive feedback amplifier, and like the first embodiment, the other positive feedback amplifier can be replaced by passive elements.

The voltage controlled oscillator described above can be formed in one semiconductor substrate, but only the tank circuit 1 can be provided outside of the semiconductor substrate.

Third Embodiment

Figure 10:
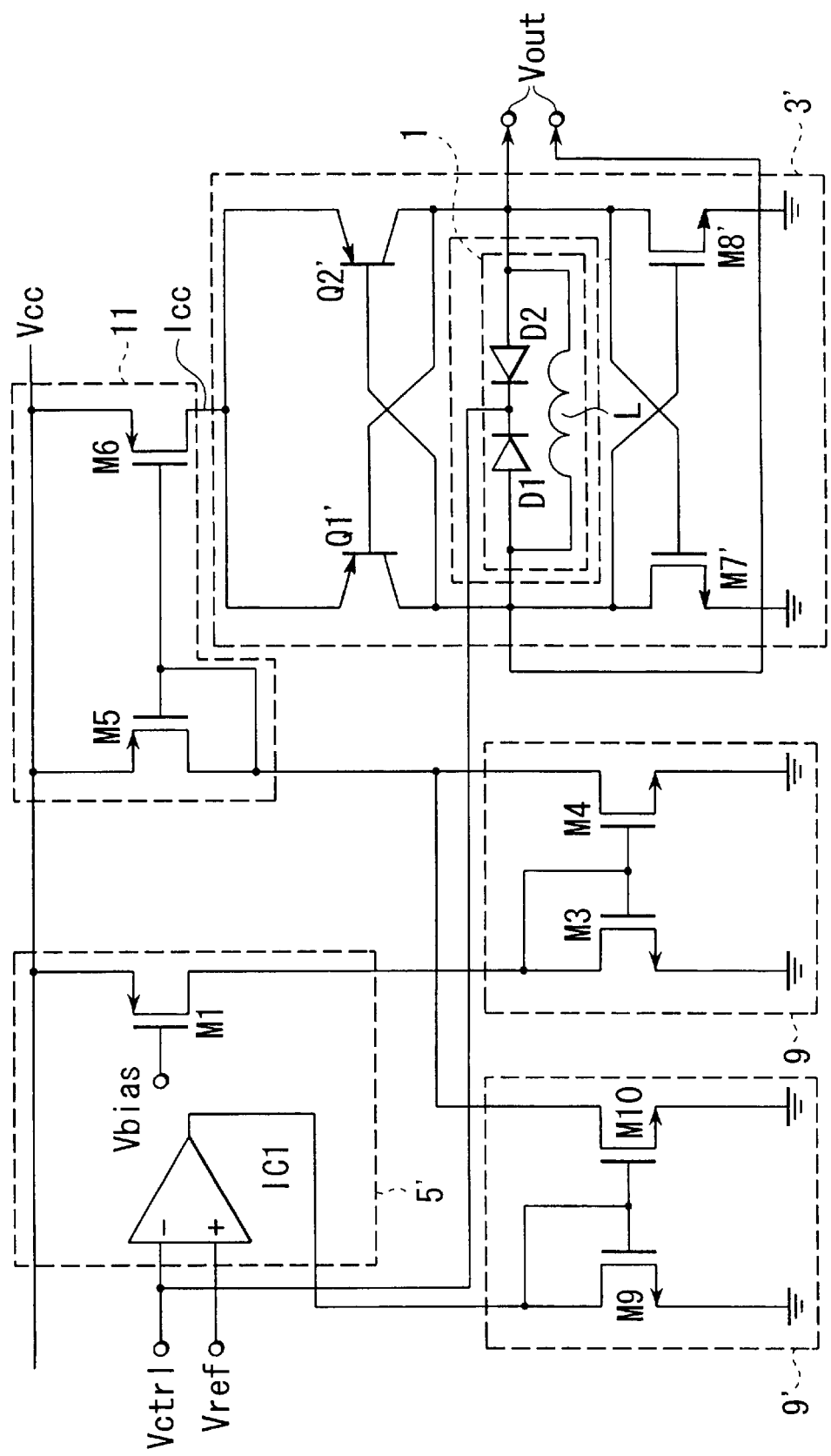
FIG. 10 is a circuit diagram of a third embodiment of a voltage controlled oscillator of this invention.

FIG. 10 is a circuit diagram of a third embodiment of a voltage controlled oscillator of this invention and the third embodiment is a modification of the first embodiment. Portions which are the same as those of the first embodiment are denoted by the same reference numerals and the repetitive explanation therefor is omitted.

The third embodiment is mainly different from the first embodiment in an input section of control voltage Vctrl in a variable current source circuit 5'. In the input section of the third embodiment, a differential amplifier IC1 is used, the control voltage Vctrl is input to the negative input terminal thereof and the reference voltage Vref is input to the positive input terminal thereof. The output terminal of the differential amplifier IC1 is connected to an input current terminal of a current mirror circuit 9' which includes FETs M9 and M10, the output current of the current mirror circuit 9' is added to an output current which is obtained as a mirror current of a constant current from the FET M1 by a current mirror circuit 9 in the output current terminal of the current mirror circuit 9.

The other circuit is basically the same as that of FIG. 5, but the circuit is different from that of FIG. 5 in that PNP bipolar transistors Q1' and Q2' are used instead of the P-MOSFETs M7 and M8 of the first embodiment and N-MOSFETs M7' and M8' are used instead of the NPN transistors Q1 and Q2. With this construction, substantially the same effect as that of the amplifier of the first embodiment can be attained.

In the first embodiment, there is a possibility that the input section of the control voltage is influenced by a variation in the threshold voltage of the FET M2 caused in the manufacturing process, but in the third embodiment, the influence of the variation in the threshold voltage can be avoided since the differential amplifier is used.

The following replacement can be made. P-MOSFETs are used instead of the PNP transistors Q1' and Q2'. NPN transistors are used instead of the N-MOSFETs M7' and M8'. PNP transistors are used instead of the P-MOSFETs M5 and M6. NPN transistors are used instead of the N-MOSFETs M3 and M4. A PNP transistor is used instead of the P-MOSFET M1.

Further, the amplifier 3' can be formed of only one positive feedback amplifier, and like the first embodiment, the other positive feedback amplifier can be replaced by passive elements.

The voltage controlled oscillator described above can be formed in one semiconductor substrate, but only the tank circuit 1 can be provided outside the semiconductor substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage controlled oscillator comprising:
   an amplifier circuit having a positive feedback construction, configured to output a signal of an oscillation frequency corresponding to a control voltage supplied to a variable capacitance element of a tank circuit having an inductor and the variable capacitance element; and
   a variable current source configured to change an operation current supplied to said amplifier circuit according to the control voltage,
   wherein, when a certain oscillation frequency at which phase noise becomes minimum is set as a reference point, said variable current source increases the operation current supplied to said amplifier circuit as the oscillation frequency becomes lower than the certain oscillation frequency, or decreases the operation current supplied to said amplifier circuit as the oscillation frequency becomes higher than the certain oscillation frequency.

2. The voltage controlled oscillator according to claim 1, wherein said variable current source includes a constant current source and an additional current source, supplies only a constant current from said constant current source to said amplifier circuit at the certain oscillation frequency at which the phase noise becomes minimum, and supplies the constant current from said constant current source and an additional current from said additional current source to said amplifier circuit when the oscillation frequency becomes lower than the certain oscillation frequency.

3. The voltage controlled oscillator according to claim 2, wherein said constant current source includes a first active element which is operated on a constant bias voltage and said additional current source includes a second active element which is connected in parallel with said first active element and operation of which is controlled by the control voltage.

4. The voltage controlled oscillator according to claim 3, wherein said additional current source includes a MOSFET having a source, a drain and a gate, the source thereof is connected to a power supply voltage or a ground voltage, the gate thereof is supplied with the control voltage, and the drain thereof supplies the additional current.

5. The voltage controlled oscillator according to claim 3, wherein said-additional current source includes a differential amplifier having two input terminals and an output terminal, one of the input terminals thereof is supplied with a reference voltage, the other of the input terminals thereof is supplied with the control voltage, and the output terminal thereof supplies the additional current.

6. The voltage controlled oscillator according to claim 1, wherein said variable current source supplies the operation current to said amplifier circuit via at least one current mirror circuit.

7. A voltage controlled oscillator comprising:
   a control terminal to which a control voltage in a preset voltage range is supplied from an exterior;
   a first current source configured to output a preset first current;
   a second current source supplied with the control voltage from said control terminal, configured to output a second current controlled by the control voltage;
   a current mirror circuit supplied with a third current obtained by adding the first and the second current, and configured to supply a fourth current which is a mirror current of the third current;
   an oscillation circuit supplied with the fourth current of said current mirror circuit and including two variable capacitance diodes whose cathodes are connected together and supplied with the control voltage, an inductor connected between two anodes of said two variable capacitance diodes and cooperating with said variable capacitance diodes to oscillate at a frequency controlled by the control voltage, and at least one positive feedback circuit which is connected between the two anodes of said two variable capacitance diodes and into which the fourth current of said current mirror circuit flows; and
   two output terminals respectively connected to the anodes of said two variable capacitance diodes.

8. The voltage controlled oscillator according to claim 7, wherein an oscillation frequency which varies with the control voltage becomes maximum when the control voltage is set at the maximum value in the preset voltage range.

9. The voltage controlled oscillator according to claim 8, wherein the second current of said second current source is zero when the control voltage is set at the maximum value in the preset voltage range and the second current of said second current source increases and the oscillation frequency decreases as the control voltage decreases.

10. The voltage controlled oscillator according to claim 7, wherein said positive feedback circuit includes two MOSFETs having gates and drains cross-coupled with each other and sources into which the fourth current of said current mirror circuit flows.

11. The voltage controlled oscillator according to claim 7, wherein said positive feedback circuit includes two bipolar transistors having bases and collectors cross-coupled with each other and the fourth current of said current mirror circuit flows therein as an emitter current.

12. The voltage controlled oscillator according to claim 7, wherein said second current source includes a p-channel MOSFET having a source connected to a power supply voltage, a gate connected to said control terminal and a drain from which the second current is output.

13. The voltage controlled oscillator according to claim 7, wherein said second current source includes a differential amplifier having a negative input terminal supplied with the control voltage, a positive input terminal supplied with a reference voltage and an output terminal from which the second current is output.

14. A voltage controlled oscillator comprising:
   a control terminal to which a control voltage in a preset voltage range is supplied from an exterior;
   a first current source into which a preset first current flows;
   a second current source which is supplied with the control voltage from said control terminal and into which a second current controlled by the control voltage flows;
   a current mirror circuit supplied with a third current obtained by adding the first and the second current and configured to supply a fourth current which is a mirror current of the third current;
   an oscillation circuit supplied with the fourth current of said current mirror circuit and including two variable capacitance diodes, anodes of which are connected together and supplied with the control voltage, an inductor connected between two cathodes of said two variable capacitance diodes and cooperating with said variable capacitance diodes to oscillate at a frequency controlled by the control voltage, and at least one positive feedback circuit which is connected between the two cathodes of said two variable capacitance diodes and into which the fourth current of said current mirror circuit flows; and
   two output terminals respectively connected to the cathodes of said two variable capacitance diodes.

15. The voltage controlled oscillator according to claim 14, wherein an oscillation frequency which varies with the control voltage becomes maximum when the control voltage is set at the minimum value in the preset voltage range.

16. The voltage controlled oscillator according to claim 15, wherein the second current of said second current source is zero when the control voltage is set at the minimum value in the preset voltage range and the second current of said second current source increases and the oscillation frequency decreases as the control voltage increases.

17. The voltage controlled oscillator according to claim 14, wherein said positive feedback circuit includes two MOSFETs having gates and drains cross-coupled with each other and sources into which the fourth current of said current mirror circuit flows.

18. The voltage controlled oscillator according to claim 14, wherein said positive feedback circuit includes two bipolar transistors having bases cross-coupled with collectors or emitters, respectively.

19. The voltage controlled oscillator according to claim 14, wherein said positive feedback circuit includes two bipolar transistors having bases and collectors cross-coupled with each other and the fourth current of said current mirror circuit flows therein as an emitter current.

20. The voltage controlled oscillator according to claim 14, wherein said second current source includes an n channel MOSFET having a source, a drain and a gate, the source thereof is connected to a ground voltage, the gate thereof is connected to the control terminal, and the drain thereof is supplied with the second current.

* * * * *